US007898882B2

(12) United States Patent
Darbinyan et al.

(10) Patent No.: US 7,898,882 B2
(45) Date of Patent: Mar. 1, 2011

(54) ARCHITECTURE, SYSTEM AND METHOD FOR COMPRESSING REPAIR DATA IN AN INTEGRATED CIRCUIT (IC) DESIGN

(75) Inventors: Karen Darbinyan, Fremont, CA (US); Gevorg Torjyan, Fremont, CA (US); Yervant Zorian, Santa Clara, CA (US); Mher Mkhoyan, Yerevan (AM)

(73) Assignee: Synopsys, Inc., Mountain View, CA (US)

( * ) Notice: Subject to any disclaimer, the term of this patent is extended or adjusted under 35 U.S.C. 154(b) by 921 days.

(21) Appl. No.: 11/766,943

(22) Filed: Jun. 22, 2007

(65) Prior Publication Data
US 2008/0008015 A1 Jan. 10, 2008

Related U.S. Application Data (60) Provisional application No. 60/816,414, filed on Jun. 23, 2006.

(51) Int. Cl.
*G11C 29/44* (2006.01)
*G06F 11/20* (2006.01)

(52) U.S. Cl. ............... 365/200; 365/201; 365/225.7; 365/230.03; 365/185.09; 365/185.11; 714/42

(58) Field of Classification Search ........... 365/185.09, 365/185.11, 200, 201, 225.7, 230.03; 714/42, 714/25
See application file for complete search history.

(56) References Cited

U.S. PATENT DOCUMENTS

| 5,398,206 | A  | * | 3/1995 | Akizawa et al. | ............. | 365/200 |
| 6,205,063 | B1 | * | 3/2001 | Aipperspach et al. | ....... | 365/200 |
| 6,744,681 | B2 | * | 6/2004 | Hogan | ........................ | 365/200 |
| 6,850,450 | B2 | * | 2/2005 | Bang et al. | ............... | 365/225.7 |

* cited by examiner

*Primary Examiner*—Andrew Q Tran
(74) *Attorney, Agent, or Firm*—Fenwick & West LLP (57) ABSTRACT

Architecture, system and method for providing compression of repair data in an IC design having a plurality of memory instances. In one embodiment, the repair data storage method includes determining repair data for each of the memory instances and compressing the repair data into a compressed format that is stored in a shared nonvolatile storage common to the memory instances.

15 Claims, 10 Drawing Sheets

ARCHITECTURE, SYSTEM AND METHOD FOR COMPRESSING REPAIR DATA IN AN INTEGRATED CIRCUIT (IC) DESIGN

PRIORITY UNDER 35 U.S.C. §119(e) & 37 C.F.R. §1.78

This nonprovisional application claims priority based upon the following prior United States provisional patent application entitled: "SHARED PROCESSOR ARCHITECTURE WITH COMPRESSION SYSTEM AND METHOD BASED ON OPTIMAL HIERARCHICAL GROUPING OF CHAIN ELEMENTS," Application No. 60/816,414, filed on Jun. 23, 2006, in the name(s) of Karen Darbinyan, Gevorg Torjyan, Yervant Zorian and Sohail Syed, which is hereby incorporated by reference.

BACKGROUND

1. Technical Field

The present disclosure relates generally to integrated circuit (IC) design. More particularly, and not by way of any limitation, the present disclosure is directed to an architecture and associated system and method for compressing repair data in an IC design having a plurality of memory instances.

2. Description of Related Art

Modern integrated circuits (ICs) such as application-specific ICs or ASICs may contain a large number of repairable memories. It is not uncommon to have 1000-2000 memories in some ASIC implementations. In such cases storing reconfiguration data to repair the memories may require upwards of 10,000 to 20,000 bits. Usually, this data may be split into multiple containers (e.g., banks of fuses) across the chip area. However, in some cases allocation of such a large container on an IC may not be possible.

SUMMARY

Broadly, the present disclosure provides an architecture and associated system and method for facilitating compression of repair data in an IC design having a plurality of memory instances, such as a System-on-Chip or SOC, for example, whereby storage required to store the repair data (i.e., reconfiguration signature) may be advantageously minimized. The compression scheme is preferably operable to take into account various statistical distributions with respect to the occurrence of active repair data (i.e., indicative of where the faults or errors have been observed during the testing of the memory instances). For example, in one embodiment, the compression scheme may be based on a random distribution model applied to the repair data. In another embodiment, the compression scheme is adapted to a clustered distribution model of the repair data. A shared non-volatile storage (NVS) container (such as, e.g., electrically programmable fuses (E-fuses) or laser programmable fuses (L-fuses)) common to all memory instances is operable to store the compressed repair signature.

In one aspect, the present disclosure is directed to repair data storage method operable with an IC design having a plurality of memory instances, comprising: determining repair data for each of the plurality of memory instances; compressing the repair data into a compressed repair data format; and storing the compressed repair data format into a shared NVS container common to the plurality of memory instances.

In another aspect, the present disclosure is directed to an IC design, comprising: a plurality of embedded memory systems each having a plurality of memory instances, wherein each memory instance is associated with a reconfiguration register and a repair register; a shared NVS container disposed outside the embedded memory systems, the shared NVS container for storing compressed repair data associated with the plurality of embedded memory systems; a shared NVS processor for executing a compression engine operable to compress repair data scanned out from each of the repair registers; and a serial interconnection for interfacing the plurality of embedded memory systems with the shared NVS processor.

In a further aspect, the present disclosure is directed to a coding method for coding repair data, wherein the method is operable with an IC design having a plurality of memory instances, comprising: grouping a plurality of data segments corresponding to the repair data into a number of groups, each group containing a set of data segments, wherein the repair data is obtained from testing the plurality of memory instances; providing a first level indication for each group to indicate if at least one data segment thereof comprises active repair data; and if a particular group has at least one data segment that comprises active repair data, providing a second level indication with respect to all data segments in the particular group that have active repair data therein.

In yet another aspect, the present disclosure is directed to a system for effectuating repair data storage in an IC design having a plurality of memory instances, comprising: means for determining repair data for each of the plurality of memory instances; means for compressing the repair data into a compressed repair data format; and means for storing the compressed repair data format, wherein the means for storing is shared by the plurality of memory instances. It will be appreciated by those skilled in the art that the various processes, operations and means set forth herein may be effectuated via software (e.g., computer-implemented program code, computer-executable instructions on a medium, or computer program product, etc.), firmware, hardware, or any combination thereof for purposes of the present patent disclosure.

BRIEF DESCRIPTION OF THE DRAWINGS

A more complete understanding of the present disclosure may be had by reference to the following Detailed Description when taken in conjunction with the accompanying drawings wherein.

DETAILED DESCRIPTION OF THE DRAWINGS

Figure 1:
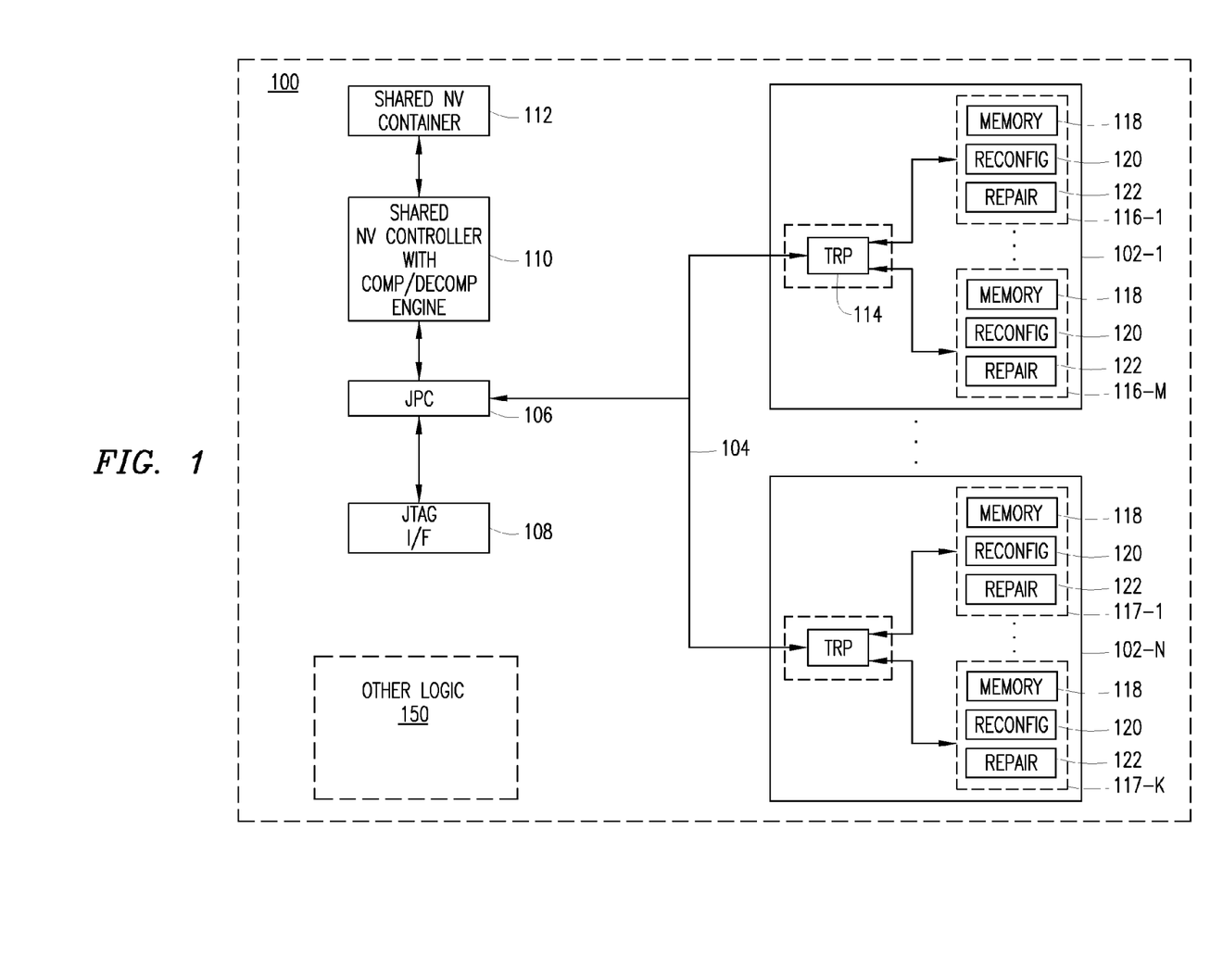
FIG. 1 depicts a high-level block diagram that exemplifies the shared architecture of an IC design in accordance with an embodiment.

In the drawings, like or similar elements are designated with identical reference numerals throughout the several views thereof, and the various elements depicted are not necessarily drawn to scale. Referring now to FIG. 1, depicted therein is a high-level block diagram that exemplifies the shared architecture of an IC design 100 in accordance with an embodiment. Design 100 is exemplary of an embedded circuit such as a System-on-Chip (SOC), wherein a plurality of memory systems 102-1 through 102-N are included. Each memory system includes a plurality of memory blocks wherein each memory block includes a memory instance, one or more reconfiguration registers and one or more repair registers. By way of illustration, memory system 102-1 includes memory blocks 116-1 through 116-M. Likewise, memory system 102-N is exemplified with memory blocks 117-1 through 117-K. Each memory block, e.g., memory block 116-1, includes a memory instance 118, a reconfiguration register 120 and a repair register 122. One of ordinary skill in the art will recognize that reconfiguration registers 120 and repair registers 122 are operable with respect to testing and repairing the corresponding memory instances 118 in known or heretofore unknown manner whereby appropriate repair data and reconfiguration data are accumulated in the respective registers. In one implementation, the reconfiguration and repair registers 120, 122 may be provided as part of an Intelligent Wrapper (IW) that may be compiled along with the compiled memory instances. Further, the memory instances 118 may be selected from dynamic random access memory (DRAM) instances, static random access memory (SRAM) instances, programmable memory instances such as electrically programmable read-only memory (EPROM) instances, Flash memory instances, register file (RF) memory instances, single-port memory instances, dual-port memory instances, and so on.

In accordance with the teachings herein, a shared nonvolatile storage (NVS) container 112 is disposed outside the memory systems 102-1 to 102-N for storing the repair data therein, preferably compressed based on a suitable algorithm as will be described in detail hereinbelow. A shared NVS processor or controller 110 is operably associated with the shared NVS container 112 for controlling the input and output of the stored repair data wherein an appropriate compression/decompression engine may be executed. In one exemplary embodiment, the shared NVS container 112 may comprise a plurality of electrically programmable fuses (E-fuses). In another embodiment, a plurality of laser programmable fuses (L-fuses) may be provided as the shared NVS container 112.

IC design 100 is preferably provided with a test interface 108 such as the Joint Test Action Group (JTAG) interface for effectuating applicable boundary scan testing with respect to the memory systems therein. In the illustrated embodiment of FIG. 1, each memory system is exemplified with a test/repair processor (TRP) 114 for controlling the overall test/repair process with respect to the memory instances of the memory system. However, it should be realized that in some embodiments there may not be a separate TRP associated with a respective memory system. Instead, the functionality of TRP 114 may be provided elsewhere in IC 100. Regardless of whether the memory systems 102-1 to 102-N are provided with a TRP, they are interfaced via a serial interconnection 104 to a converter 106 operable to convert the JTAG signals to another standard referred to as IEEE 1500 which specifies core test mechanisms (e.g., scan, Built-In-Self-Test or BIST, etc.) for embedded cores. Additionally, IC design 100 may also contain other circuitry or logic 150 as part of its architecture.

Figure 2A:
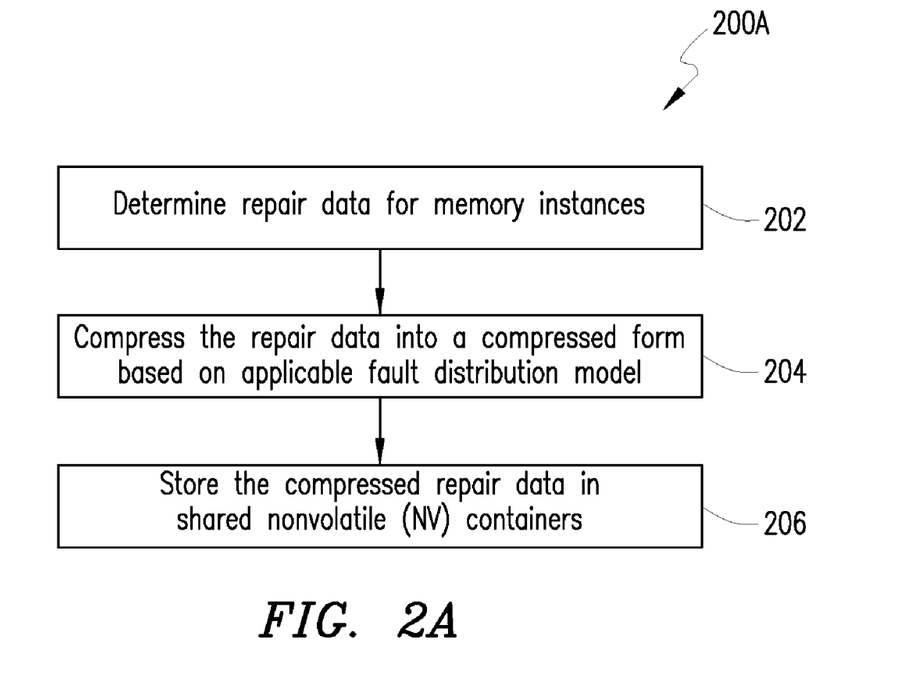
FIGS. 2A-2C are flowcharts associated with a repair data storage scheme operable with the IC design of FIG. 1 in one embodiment.
Figure 2B:
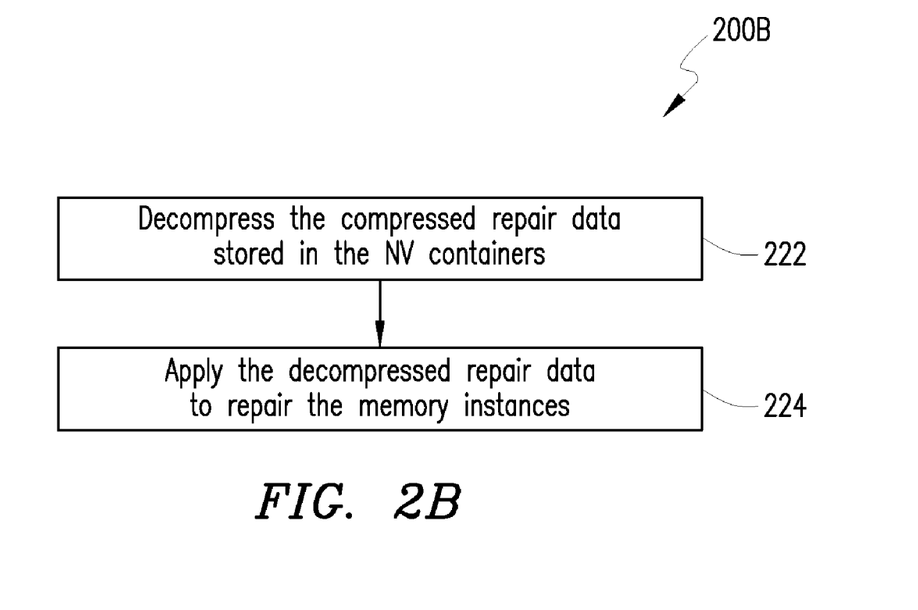

FIGS. 2A-2C are flowcharts associated with a repair data storage scheme operable with the IC design of FIG. 1 in one embodiment. Reference numeral 200A of FIG. 2A is illustrative of the scheme at one level. First, repair data is determined for the memory instances (e.g., memory instances 118 shown in FIG. 1) based on applicable testing (block 202). Thereafter, the repair data is compressed into a compressed form based on applicable fault distribution model (block 204) whereby the amount of storage required to store the repair data (also referred to as the repair signature) may be advantageously minimized. In other words, the compression scheme of block 204 is preferably operable to take into account various statistical distributions with respect to the occurrence of active repair data (i.e., indicative of where the faults or errors have been observed during the testing of the memory instances). For example, in one embodiment, the compression scheme may be based on a random distribution model applied to the repair data. In another embodiment, the compression scheme is adapted to a clustered distribution model of the repair data. Regardless of how the repair data is compressed, it is stored in a shared NVS container that is appropriately sized (block 206). Reference numeral 200B in FIG. 2B is illustrative of the process relating to using the compressed repair data. The compressed repair data is scanned out from the shared NVS container(s) and decompressed using a suitable algorithm (block 222). Thereafter, the decompressed repair data is utilized for repairing the memory instances (block 224) based on the contents thereof.

Figure 2C:
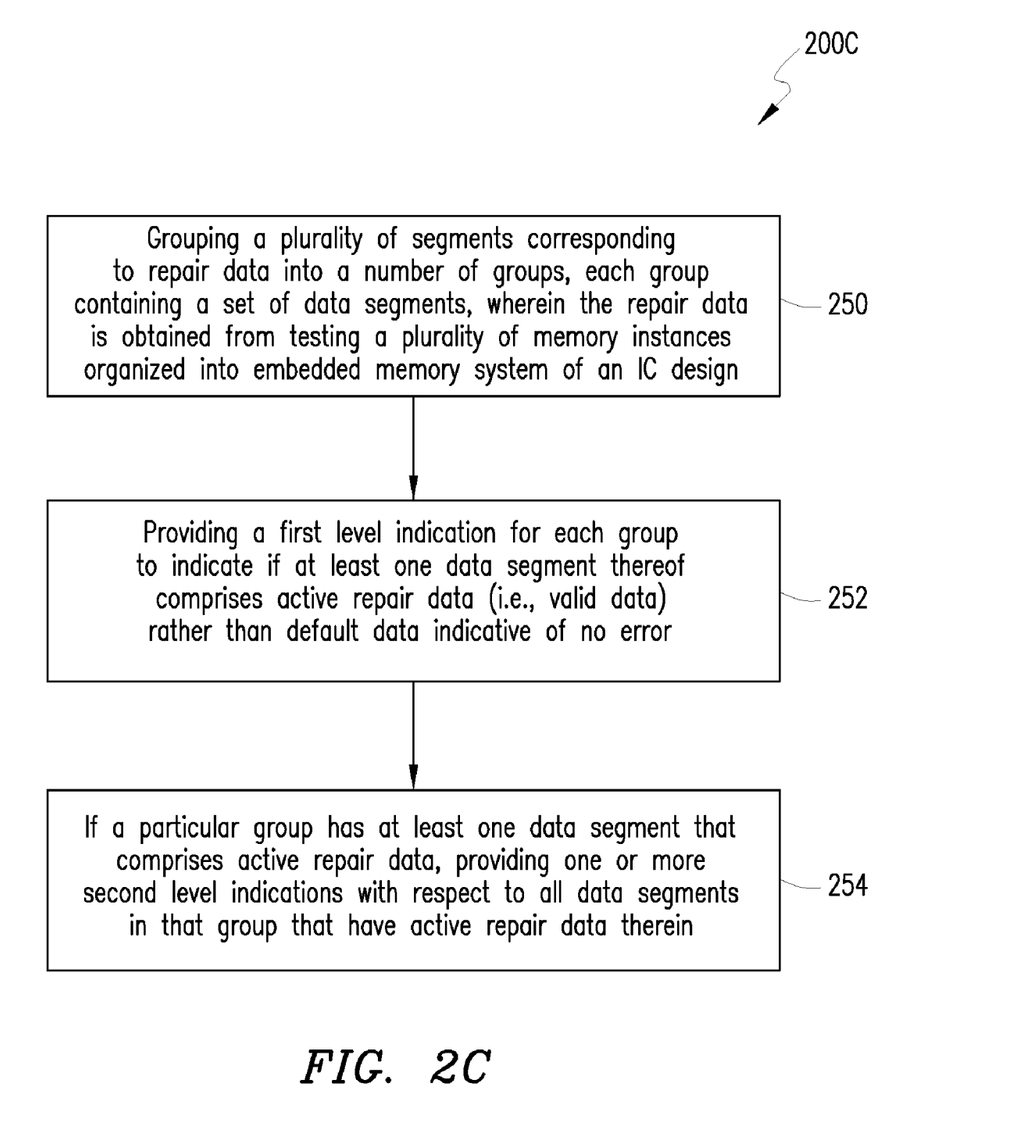

Reference numeral 200C in FIG. 2C is illustrative of an exemplary high level coding scheme 200C operable for purposes of coding the repair data in accordance with the teachings of the present patent disclosure. Raw repair data (i.e., uncompressed data) obtained upon testing a plurality of memory instances may be viewed as a stream of bits wherein each memory instance may have a number of data segments allocated thereto that correspond to the number of repair elements it is provided with. Typically, each data segment is provided with a predetermined size (e.g., 8-16 bits or thereabouts). Depending upon whether and where a memory instance has a fault, corresponding data segments are appropriately filled with the active repair data. Where there are no faults, the corresponding data segments are filled with default data (e.g., all 0's) for the memory instance. As provided in block 250, the coding scheme embodiment 200C involves grouping a plurality of data segments corresponding to the repair data into a number of groups, preferably of equal size. As alluded to previously, the repair data may be obtained upon testing a plurality of memory instances that are embedded in an IC design, either with or without using separate test/repair processors, or with or without a wrapper associated with each memory instance. A first level indication (e.g., a flag) is provided for each group of the data segments to indicate if at least one data segment thereof comprises valid data, i.e., active repair data (block 252). As pointed out before, if there is no error or fault in a memory instance, the corresponding data segment is filled with default data instead of any repair data. Accordingly, if all the data segments of a particular group contain default data, then a flag associated with the group may be appropriately set (e.g., set to 0) to indicate that the entire group has nothing but default data. If a particular group has one or more data segments that include active repair data, a second level indication may be provided with respect to such data segments having the valid data (block 254). In one embodiment, the second level indication may comprise an address (having one or more bits). In another embodiment, the second level indication may comprise an Enable flag. The issue of how the second level indications may be provided for a repair data stream may be resolved based on certain assumptions regarding the distribution of errors (and the repairs, by extension) in an IC design. As will be described in further detail below, the present disclosure provides two exemplary compression/decompression embodiments based on applicable statistical models although one skilled in the art will recognize that different compression schemes may be obtained within the scope of the teachings hereof. Further, it should be apparent that additional levels of hierarchical groupings of a repair data stream may also be provided wherein each level may be provided with a suitable indication to indicate whether and/or where a particular level has valid repair data therein.

Figure 3:
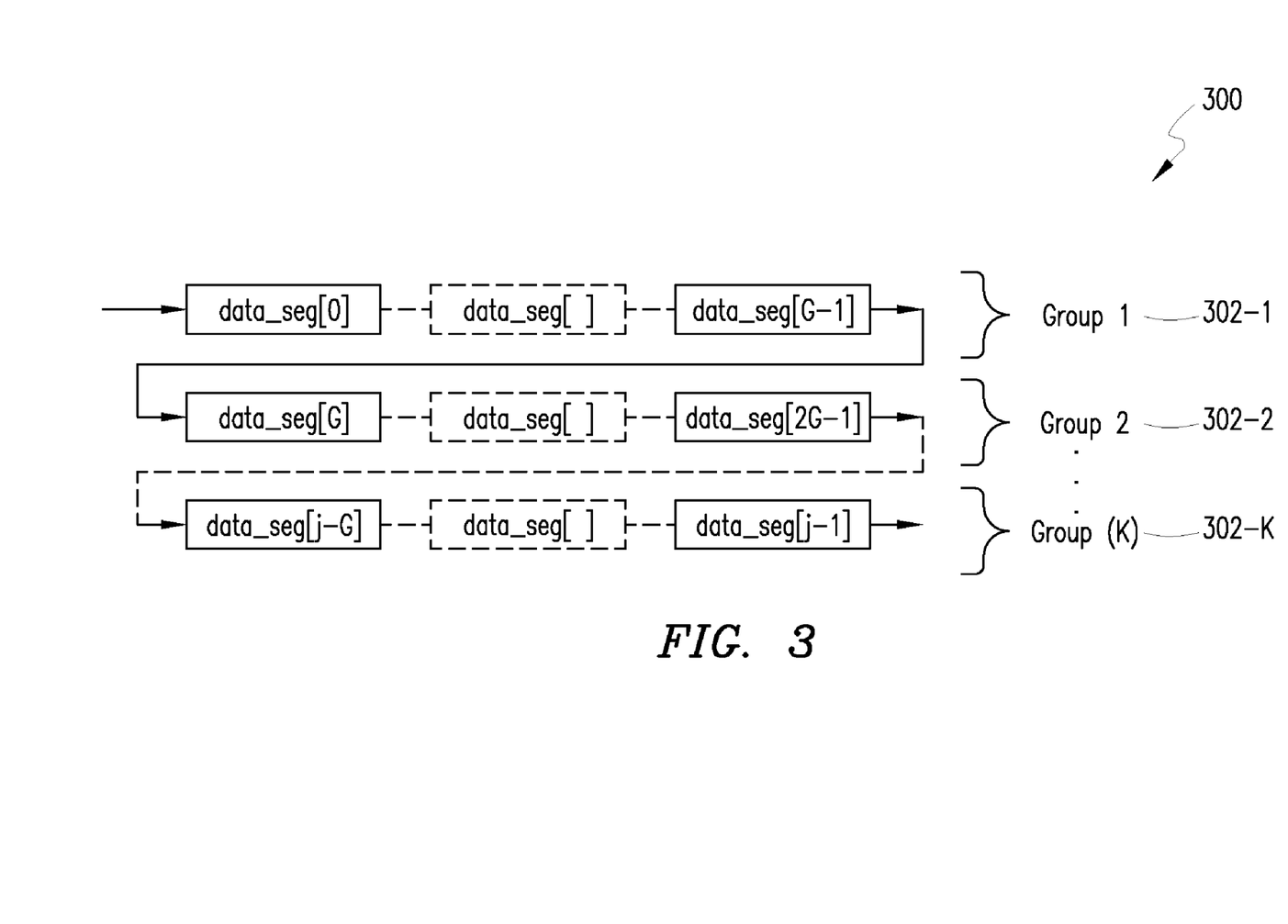
FIG. 3 depicts an exemplary hierarchical grouping arrangement with respect to a chain of repair data segments that may be compressed in accordance with the teachings of the present patent application.

FIG. 3 depicts an exemplary hierarchical grouping arrangement 300 with respect to a chain of repair data segments that may be compressed in accordance with the teachings of the present patent application. As illustrated, a total of j data segments (data_seg[0] through data_seg [j−1]) comprise the entire uncompressed repair signature. Each data segment has known width, and for most practical purposes, only a few data segments typically have actual repair data in them, the rest simply carrying default data. The j data segments can be logically grouped into K groups 302-1 through 302-K, each containing G data segments, where K=j/G. Depending on the semiconductor technology, fabrication process as well as fault distribution, failures can be randomly distributed across the groups, or they can be concentrated mostly in the same area (i.e., clustering model). Accordingly, a compression algorithm operating on the hierarchically grouped data 300 may take into account such fault distribution models in order to appropriately reduce the amount of data such that only relevant portions may need to be stored. Further, because of such reduction in the data, the total amount of shared storage required for storing a combined repair signature associated with a plurality of memory instances may also be advantageously reduced as a consequence.

Figure 4:
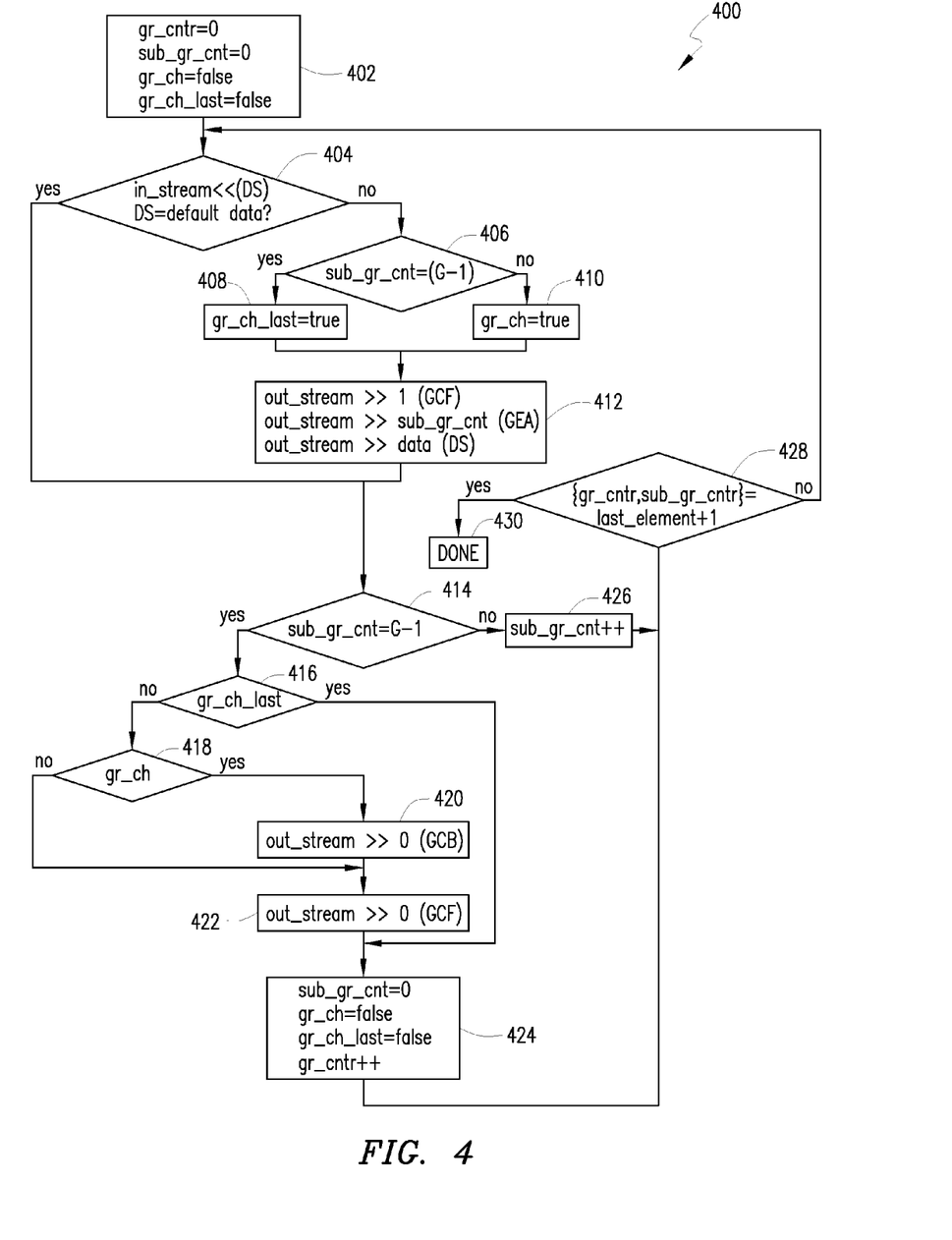
FIGS. 4 and 5 are flowcharts associated with a compression and decompression scheme, respectively, according to one embodiment.
Figure 5:
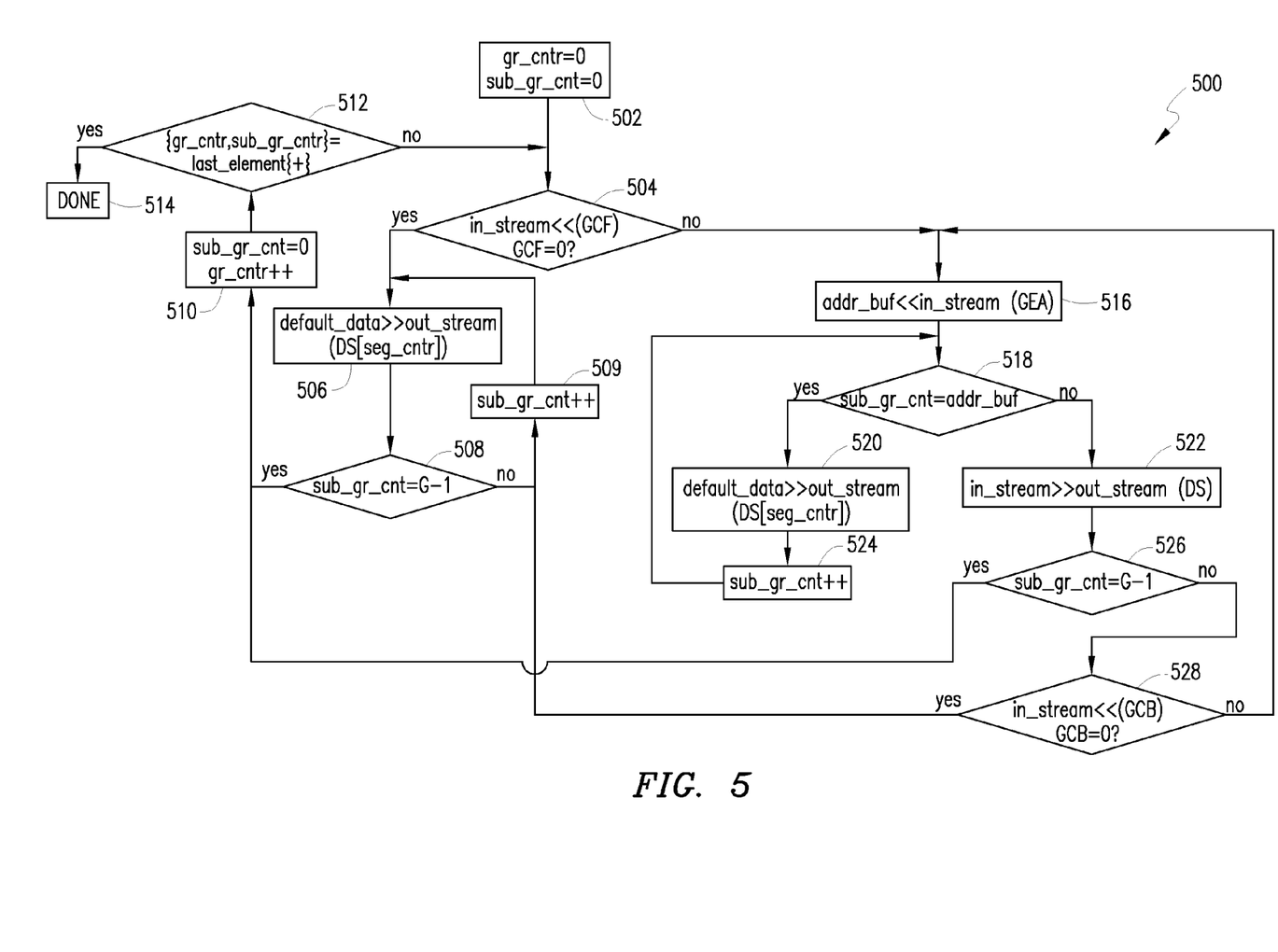

FIGS. 4 and 5 are flowcharts associated with a compression and decompression scheme, respectively, according to one embodiment where the faults are assumed to be randomly distributed among a chain of repair data segments hierarchically organized into a number of groups as described above. Essentially, the coding algorithm operates as follows in one exemplary implementation. If a group $G_i$ has at least one data segment with active data, then a Group Change Flag (GCF) associated with that particular group $G_i$ is set to a particular logic level (e.g., binary 1). The GCF of the group $G_i$ is followed by an address field called Group Element Address (GEA) that locates a data segment (DS) within the group having valid repair data. Another indicator, Group Change Bit (GCB), follows thereafter which indicates whether there are more than one DS with valid repair data. Again, if a GCB is set (e.g., binary 1), it means that there are additional data segments in that group $G_i$ that have valid repair data. The coding for the group $G_i$ may continue until the end of the group is reached, accordingly. Additional variations may be implemented within the broad scheme set forth herein. For instance, if a GEA is the address of the last DS in a group, then the GCB field may be skipped and the GCF of the next group may be followed.

Reference numeral 400 in FIG. 4 refers to an embodiment operable as a compression engine or state machine to compress an uncompressed repair data stream (i.e., raw bit stream having valid repair data and default data interspersed therein) in accordance with the teachings set forth above. A number of counters, flags, variables and the like may be initialized before the raw bit stream is operated upon (block 402). In particular, gr_cntr (for incrementing the groups to j/G) and sub_gr_cnt (for incrementing well as specifying a location of the data segments within a group from [0] to [G−1]) are set to binary 0. In addition, gr_ch (to indicate GCF) and gr_ch_last (to indicate GCB) are set to a particular Boolean value, e.g., false. By way of convention, in_stream is a variable for the uncompressed bit stream whereas the compressed data is initialized as out_stream. After loading a data segment (DS), it is checked if it contains default data (block 404). If negative, another determination is made (block 406) to determine if sub_gr_cnt has reached the last segment (i.e., [G−1]). If so, the Boolean value of gr_ch_last is set to true (block 408). Otherwise, the Boolean value of gr_ch is set to true (block 410). Process control from either block 408 or block 410 flows to block 412 where a number of parameters regarding the compressed bit stream (i.e., out_stream) are set. As illustrated, out_stream is generated with GCF being set to binary 1 wherein the value of sub_gr_cnt is output as GEA, followed by the actual data of the data segment. Process control from block 404 (if the data stream did not contain any valid repair data) or from block 412 flows to a decision block 414 where it is determined if sub_gr_cnt=[G−1]. If not, sub_gr_cnt is incremented (block 426). Otherwise, further determinations are made with respect to the Boolean values of gr_ch_last (block 416) and gr_ch (block 418), to indicate there are no more data segments with valid repair data (i.e., GCB=0) which is provided as out_stream (block 420). Upon providing GCF=0 as out_stream (block 422), the variables and counters are reinitialized, with gr_cntr being incremented (block 424). Incremented sub_gr_cnt and gr_cntr are checked against the boundary conditions (i.e., if they have reached their respective last elements) in block 428. If so, the compression process is complete (block 430); otherwise, process control flows back to verifying if the next DS in the in_stream contains valid data (block 404) to continue the process again in an iterative manner.

In similar fashion, reference numeral 500 in FIG. 5 refers to an embodiment operable as a decompression engine or state machine to decompress a compressed repair data stream (e.g., such as the out_stream as obtained above) for purposes of the present patent disclosure. At block 502, two counters, gr_cntr and sub_gr_cnt, are initialized before the decompression process is commenced. By convention, the compressed data is initialized as in_stream for purposes of this embodiment. At block 504, a determination is made if the compressed stream's GCF is 0 (indicating there are no data segments with valid repair data in the group). If so, default data is provided as out_stream (which is corresponds to the uncompressed data in this embodiment) until all the data segments are exhausted as indicated by the iterative loop comprising blocks 506, 508 and 509. Once the group's end has been reached (i.e., sub_gr_cnt [G−1]) as shown in block 508, sub_gr_cnt is reinitialized to 0 and gr_cntr is incremented (so that the next group may be interrogated, if available (block 510). If there are no additional groups to be decompressed (block 512), the decompression process is deemed complete (block 514). Otherwise, process control flows to commence decompression of the next group by interrogating its GCF as previously described with respect to block 504.

If a group's GCF=1 (as determined in block 504), it is indicative of at least one data segment having valid repair data therein and process control flows to block 516 instead of the iterative loop described above. At block 516, GEA of in_stream is loaded into a variable called addr_buf to effectuate further determinations. If sub_gr_cnt=addr_buf (block 518), the repair data of the compressed in_stream is shifted out as a data segment in out_stream (block 522). Otherwise, the default data is shifted out (block 520), whereupon sub_gr_cnt is incremented (block 524) to interrogate for the next data segment. This loop continues until at least the first instance of the repair data of the compressed in_stream is shifted out as provided in block 522, whereupon a determination is made if the data segments for a particular group have been decompressed (block 526). If not, a GCB from in_stream is examined to determine if there are additional data segments in the group having valid repair data (block 528). If so (i.e., GCB is not equal to 0), process flow reverts to examining the next address field in the compressed data (block 516). Otherwise, default data is shifted out for the remainder of data segments in the group as provided by the iterative loop comprising blocks 506, 508 and 509.

Associated with the random fault distribution model described above, the size of compressed data may be calculated based on the following equation:

$$N_f = \Sigma(1 + \log_2(N_{m[i]} + N_{r[j]}) + N_{GROUP} \qquad (1)$$

where
$N_r$=number of worst case required repairs
$N_m$=number of repairable fields in the repair chain
$N_b$=average number of data bits for repair per element (i.e., data segment)
$N_{m[i]}$=number of reconfiguration elements in i-th group
$N_{r[j]}$=number of bits in compressed form for j-th reconfiguration element
$N_{GROUP}$=number of groups
$N_f$=number of storage elements in NVS container Considering that repair elements are grouped in K groups of equal size, and if the number of repairs $N_r$ is known, the number of required storage elements is given as follows:

$$N_f(K) = [2 + N_b + \log_2(N_m/K)]N_r + K \qquad (2)$$

The minimal number of compressed bits will be achieved if repair elements are split in K groups of equal size G, where $$K = N_r/\log_2 \qquad (3)$$

$$G = [N_M/N_r] \log_2 \qquad (4)$$

As one skilled in the art will appreciate, the calculations for K or G may be rounded up appropriately to account for the binary numbering system, e.g., to the highest number that satisfies $2^x$ for some x.

Figure 6:
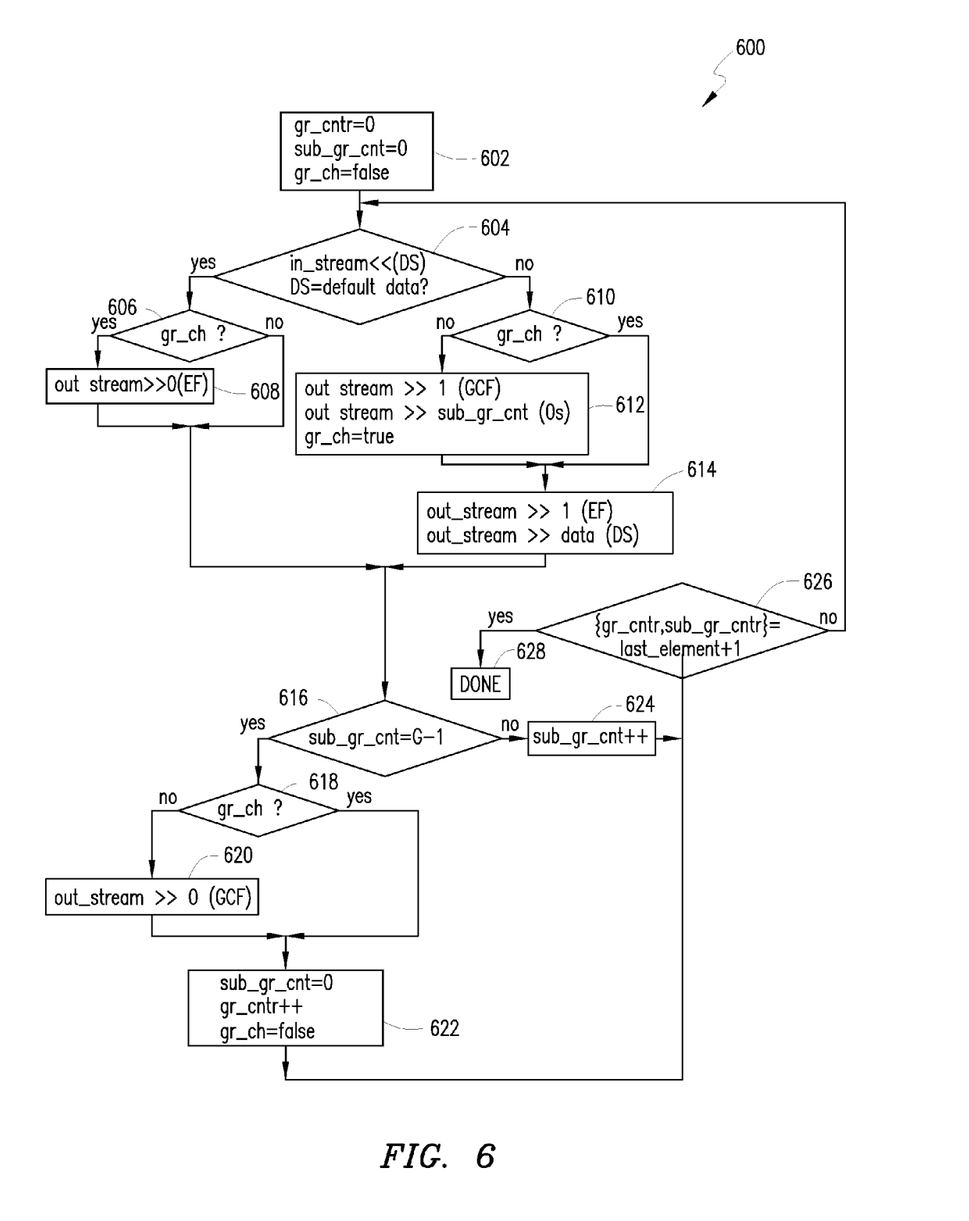
FIGS. 6 and 7 are flowcharts associated with a compression and decompression scheme, respectively, according to another embodiment.
Figure 7:
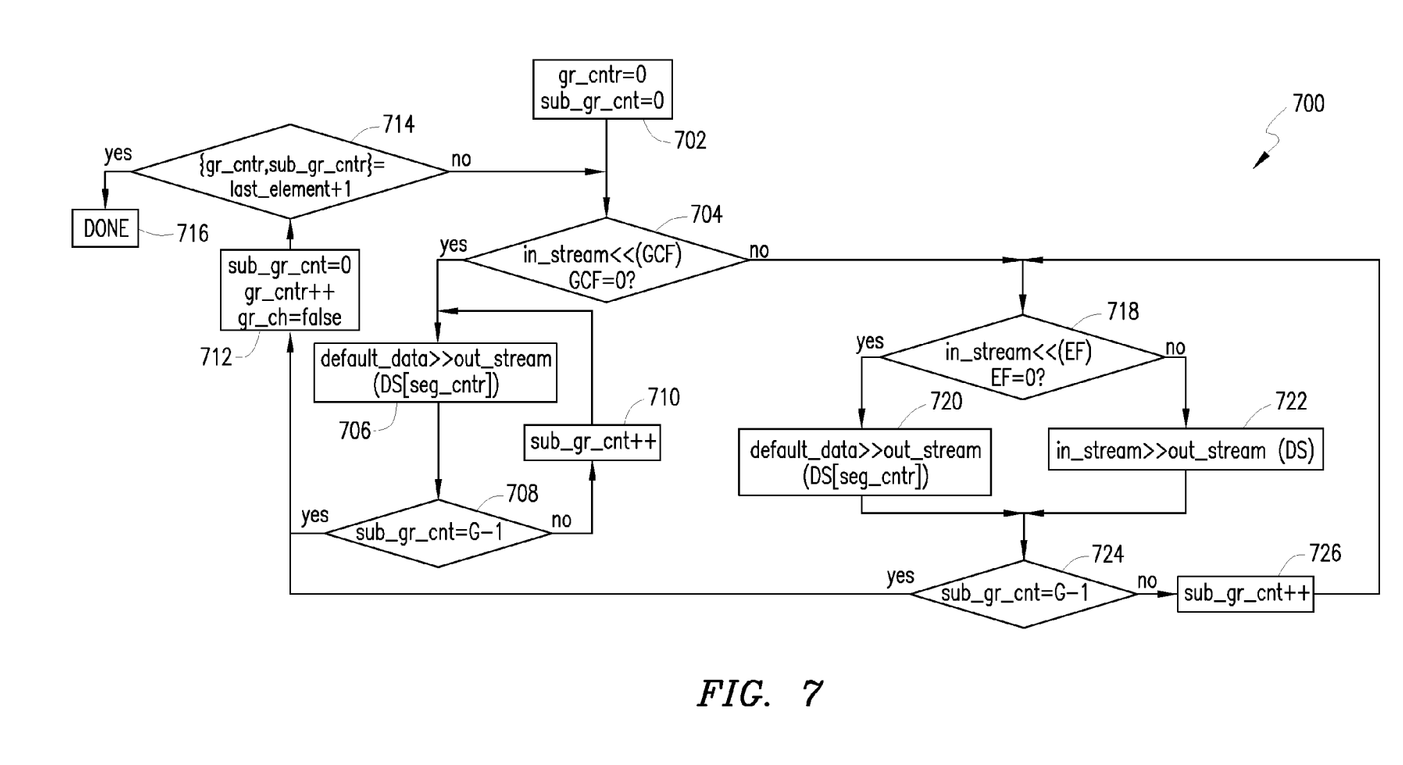

FIGS. 6 and 7 are flowcharts associated with a compression and decompression scheme, respectively, according to another embodiment where the faults are assumed to be concentrated in some data segments among a chain of hierarchically organized repair data segments. Similar to the coding algorithm described previously, if a particular group $G_i$ has at least one data segment with active data, a GCF associated with that group $G_i$, is set to a particular logic level (e.g., binary 1). The GCF of the group $G_i$ is followed by an Enable Flag (EF), which is then followed by active repair data (i.e., DS) depending upon the setting of EF (e.g., EF=1). Here, there is no particular indication is provided to indicate whether a group has additional data segments with active repair data, however. The coding for the group $G_i$ continues with appropriate EF indicators until the end of the group is reached, accordingly. As before, it will be recognized that further variations may be implemented within the broad scheme set forth herein.

Reference numeral 600 in FIG. 6 refers to an embodiment operable as a compression engine or state machine to compress an uncompressed repair data stream in accordance with a clustered distribution model described above. Similar to the compression scheme described previously, a number of counters, flags, variables and the like may be initialized before the raw bit stream is operated upon (block 602). In particular, gr_cntr and sub_gr_cnt are set to binary 0 and gr_ch is set to false. Again, in_stream is a variable for the uncompressed bit stream whereas the compressed data is initialized as out_stream in this embodiment. After loading a data segment (DS), it is checked if is contains default data (block 604). If so, EF=0 is shifted out as out_stream (blocks 606 and 608). If DS contains actual repair data, another determination is made (block 610) with respect to the Boolean value of gr_ch that determines whether a GCF precedes first (block 612) or an EF is shifted out first (block 614). At block 612, a binary 1 is shifted out as GCF in out_stream and gr_ch set to true. In block 614, an EF=1 follows thereafter, followed by the repair data as out_stream. Process control from blocks 606, 608 or 614 flows to block 616 where it is determined if sub_gr_cnt has reached the last segment (i.e., [G−1]). If so, the Boolean value of gr_ch is tested (block 618). Depending upon the determination, a binary 0 is shifted out as GCF (block 620). Thereafter, reinitialization takes place (block 622) wherein sub_gr_cnt is set to binary 0, gr_cntr is incremented and gr_ch is set to false.

If sub_gr_cnt has not reached the last segment (i.e., [G−1]) as determined by block 616, it gets incremented also (block 614). The incremented counters are then tested if the last element has been reached (i.e., either the last group has been reached or the last data segment of the current group has been reached) (block 626). If both conditions are met, the compression process is complete (block 628); otherwise, process control flows back to determining if the next data segment has default data (block 604) in order to continue with the process in an iterative manner.

Referring now to FIG. 7, depicted therein is an embodiment 700 operable as a decompression engine or state machine to decompress a compressed repair data stream (e.g., such as the out_stream as obtained above). At block 702, gr_cntr and sub_gr_cnt are initialized before the decompression process is commenced. By convention, the compressed data is initialized as in_stream for purposes of this embodiment. At block 704, a determination is made if the compressed stream's GCF is 0 (indicating there are no data segments with valid repair data in the group). If so, default data is provided as out_stream (which corresponds to the uncompressed data in this embodiment) until all the data segments are exhausted as indicated by the iterative loop comprising blocks 706, 708 and 710. Once the group's end has been reached (i.e., sub_gr_cnt=[G−1]) as shown in block 708, sub_gr_cnt is reinitialized to 0, gr_cntr is incremented and gr_ch is set to false (block 712). If no additional groups to be decompressed (block 714), the decompression process is deemed complete (block 716). Otherwise, process control flows to decompressing the next group by interrogating its GCF as previously described with respect to block 704.

If a group's GCF=1 (as determined in block 704), it is indicative of at least one data segment having valid repair data therein and process control flows to block 718 instead of the iterative loop described above. At block 718, EF of in_stream is interrogated to effectuate further determinations. If EF=0 (block 718), the repair data of the compressed in_stream is shifted out as a data segment in out_stream (block 722). Otherwise, the default data is shifted out (block 720). A determination made if all the data segments in the group have been exhausted (block 724). If not, sub_gr_cnt is incremented (block 726) to interrogate for the next data segment. If all the data segments in the group have been decompressed, process control flows to block 712 where sub_gr_cnt is reinitialized to 0, gr_cntr is incremented and gr_ch is set to false. As before, if no additional groups to be examined (block 714), the decompression process is deemed complete (block 716). Otherwise, process control flows block 704 in an iterative manner with respect to the remaining compressed data.

Associated with the clustered fault distribution model described above, the number of storage elements for a given G may be calculated based on the following equation:

$$N_f(G) = [N_m/G] + (G + N_b) * N_r \quad (5)$$

where
$N_r$ = number of worst case required repairs
$N_m$ = number of repairable fields in the repair chain
$N_b$ = average number of data bits for repair per element (i.e., data segment)
$N_f$ = number of storage elements in NVS container To find a minimum of this function (Equation 5), it may be differentiated as follows:

$$N_f(G)' = N_r - [N_m/G^2] \quad (6)$$

for solving the following equation:

$$N_r - [N_m/G^2] = 0 \quad (7)$$

which gives rise to $G = (N_m/N_r)^{1/2}$. Accordingly, in the embodiment illustrated, repair elements must be distributed in groups equal to G to minimize the size of NVS repair container, which is a function of number of repairable fields in the repair chain and number of required repairs.

Figure 8:
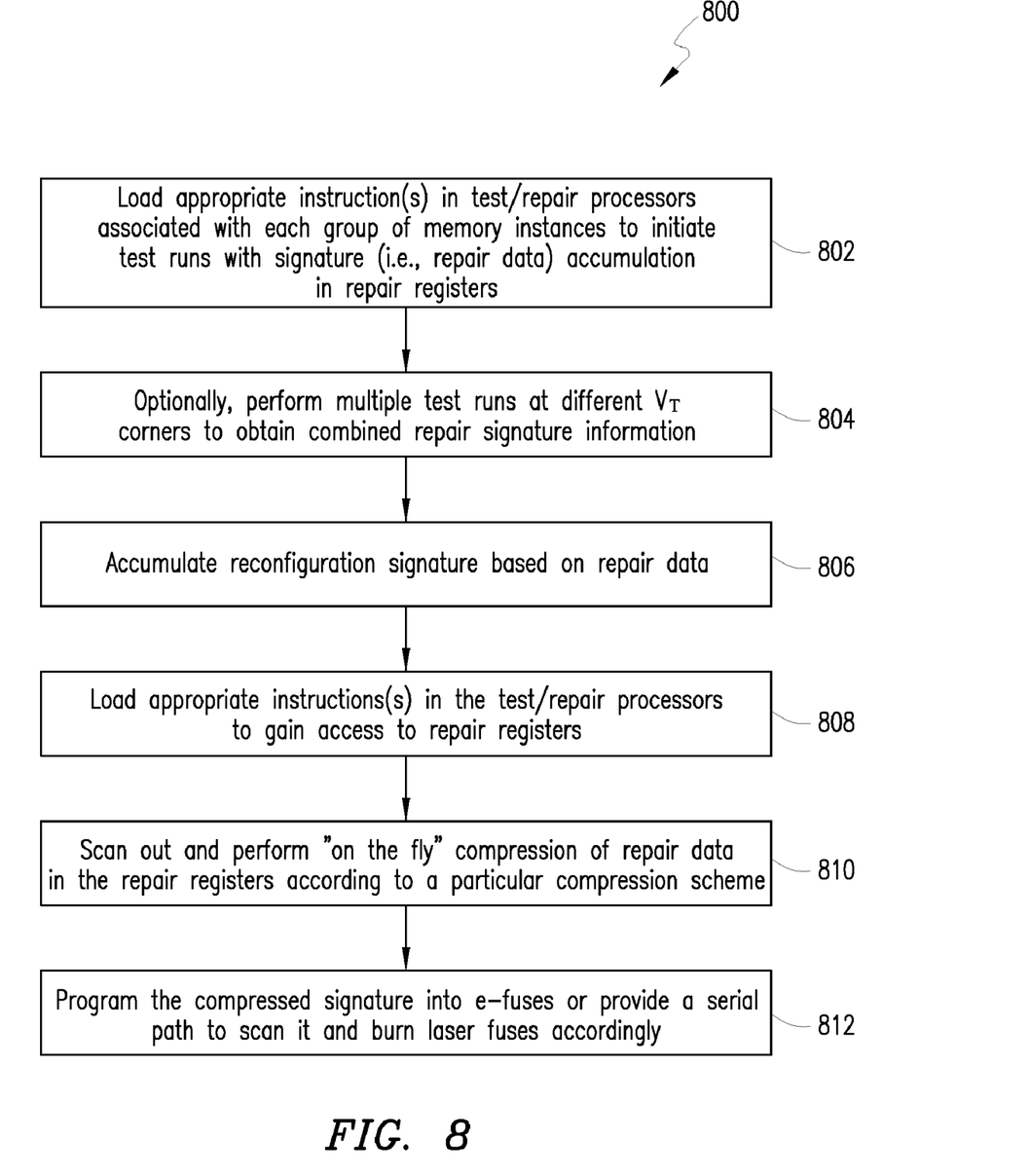
FIGS. 8 and 9 are flowcharts associated with certain operations relating to test and repair of an IC design such as the IC design shown in FIG. 1 according to one embodiment of the present patent application.
Figure 9:
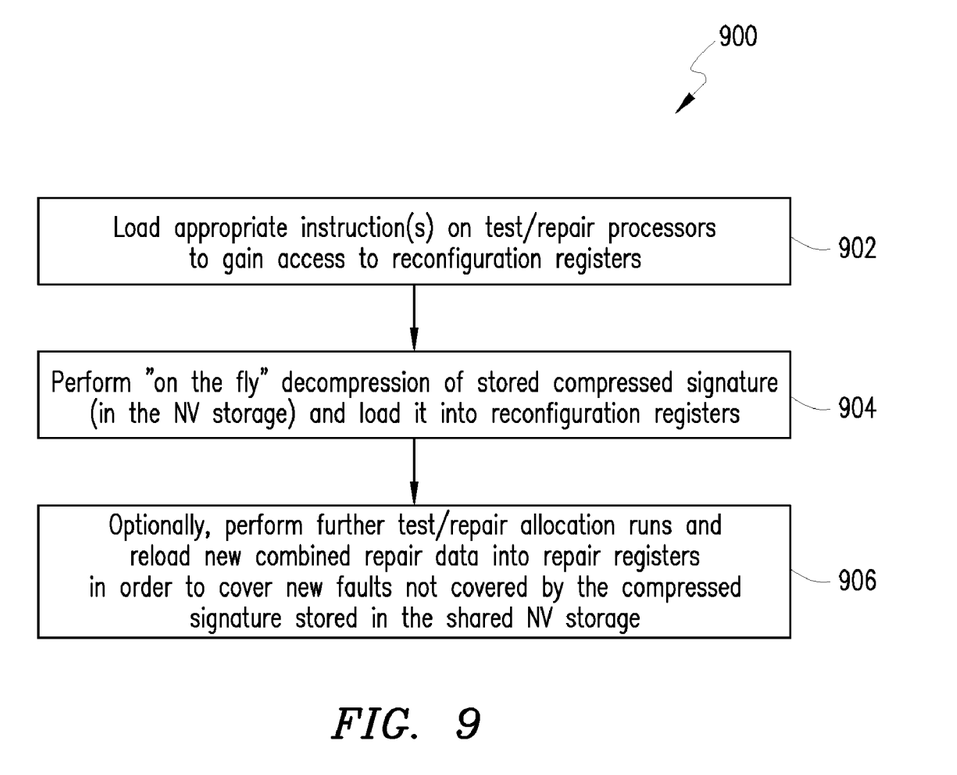

FIGS. 8 and 9 are flowcharts associated with certain operations relating to test and repair of an IC design such as the SOC design shown in FIG. 1 according to one embodiment of the present patent application. Reference numeral 800 refers to a methodology to obtain compressed repair signature by a compression engine executing on shared NVS processor 110. At block 802, appropriate instructions may be loaded in TRPs 114 associated with each group of memory instances 118 to initiate test runs for accumulating appropriate signature information in the repair registers 122. Optionally, multiple test runs may be performed at different threshold voltage ($V_T$) corners in order to obtain combined repair signature information (block 804). During the test process, the memory instances 118 accumulate a reconfiguration signature based on the faults detected and stored as repair data (block 806). Appropriate instructions may be loaded in TRPs 114 to gain access to the repair registers 122 (e.g., via a serial interface), whereupon the repair data may be scanned out and compressed "on the fly" by a compression engine executing on NVS processor 110 in accordance with one or more embodiments set forth hereinabove (block 810). The compressed repair signature may be automatically programmed into the NVS container 112, which in one implementation may be comprised of E-fuses as alluded to previously. In another embodiment, a serial path may be provided to scan the compressed repair data through a JTAG interface on automated test equipment (ATE) that could be used to burn laser fuses of the NVS container 112 accordingly. These processes are set forth in block 812.

To effectuate repair based on compressed repair signature, the shared NVS processor/controller 110 performs the operations set forth as embodiment 900 depicted in FIG. 9. Appropriate instructions are loaded in TRPs 114 to gain access to the reconfiguration registers 120 (block 902). The decompression engine executing on the shared NVS processor/controller 110 performs "on the fly" decompression of the compressed repair signature stored NVS container 112 according to the embodiments set forth hereinabove, whereupon it is loaded into the reconfiguration registers 120 in order to effectuate repair. Optionally, additional test/repair allocation runs may be performed to reload new combined repair data into repair registers in order to cover new faults not covered by the compressed signature stored in the shared NVS container 112 (block 906).

It is believed that the operation and construction of the embodiments of the present disclosure will be apparent from the foregoing Detailed Description. While some aspects of the method and circuitry shown and described may have been characterized as being preferred, it should be readily understood that various changes and modifications could be made therein without departing from the scope of the present disclosure as set forth in the following claims.

What is claimed is:

1. A repair data storage method operable with an integrated circuit (IC) design having a plurality of memory instances, comprising:
   determining repair data for each of said plurality of memory instances;
   compressing said repair data into a compressed repair data format; and
   storing said compressed repair data format into a shared nonvolatile storage (NVS) common to said plurality of memory instances.

2. The repair data storage method as set forth in claim 1, wherein said repair data is determined by running one or more tests by a test and repair processor (TRP) associated with said plurality of memory instances.

3. The repair data storage method as set forth in claim 1, wherein said plurality of memory instances are organized into a number of embedded memory systems, each memory system having a TRP associated therewith for performing one or more tests with respect to a sub-plurality of memory instances thereof.

4. The repair data storage method as set forth in claim 1, wherein said repair data is compressed "on the fly" by a shared NVS processor as said repair data is scanned out from a group of registers associated with said plurality of memory instances.

5. The repair data storage method as set forth in claim 1, wherein said repair data is compressed based on a particular fault distribution model.

6. The repair data storage method as set forth in claim 5, wherein said particular fault distribution model comprises a random distribution model.

7. The repair data storage method as set forth in claim 5, wherein said particular fault distribution model comprises a clustered distribution model.

8. The repair data storage method as set forth in claim 1, wherein said compressed repair data format is stored into a plurality of electrically programmable fuses (E-fuses) forming said shared NVS.

9. The repair data storage method as set forth in claim 1, wherein said compressed repair data format is stored into a plurality of laser programmable fuses (L-fuses) forming said shared NVS.

10. A system for effectuating repair data storage in an integrated circuit (IC) design having a plurality of memory instances, comprising:
    means for determining repair data for each of said plurality of memory instances;

means for compressing said repair data into a compressed repair data format; and means for storing said compressed repair data format, wherein said means for storing is shared by said plurality of memory instances.

11. The system as set forth in claim 10, wherein said means for determining repair data is operable by running one or more tests by a test and repair processor (TRP) associated with said plurality of memory instances.

12. The system as set forth in claim 10, wherein said plurality of memory instances are organized into a number of embedded memory systems, each memory system having a TRP associated therewith for performing one or more tests with respect to a sub-plurality of memory instances thereof.

13. The system as set forth in claim 10, wherein said means for compressing comprises a compression engine executing on a shared processor, said compression engine operating to compress said repair data "on the fly" as said repair data is scanned out from a group of registers associated with said plurality of memory instances.

14. The system as set forth in claim 10, wherein said means for storing said compressed repair data format comprises a plurality of electrically programmable fuses (E-fuses).

15. The system as set forth in claim 10, wherein said means for storing said compressed repair data format comprises a plurality of laser programmable fuses (L-fuses).

* * * * *